(12) United States Patent
Kurimoto et al.

(10) Patent No.: US 7,052,934 B2
(45) Date of Patent: May 30, 2006

(54) FABRICATION METHOD OF SEMICONDUCTOR DEVICE

(75) Inventors: Hideyuki Kurimoto, Tenri (JP); Yoshihisa Dotta, Nara (JP); Toshio Kimura, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 71 days.

(21) Appl. No.: 10/787,740

(22) Filed: Feb. 27, 2004

(65) Prior Publication Data

US 2004/0188861 A1 Sep. 30, 2004

(30) Foreign Application Priority Data

Mar. 27, 2003 (JP) .................. 2003-089348

(51) Int. Cl.
*H01L 21/44* (2006.01)

(52) U.S. Cl. ............... 438/106; 438/107; 438/110

(58) Field of Classification Search ............ 438/106
See application file for complete search history.

(56) References Cited

U.S. PATENT DOCUMENTS

| 6,287,891 | B1 * | 9/2001 | Sayyah | ............ 438/106 |
| 6,492,195 | B1 | 12/2002 | Nakanishi et al. | |
| 6,814,832 | B1 * | 11/2004 | Utsunomiya | ............ 156/230 |

FOREIGN PATENT DOCUMENTS

| JP | 6-80938 A | 3/1994 |
| JP | 6-169006 A | 6/1994 |
| JP | 7-145357 A | 6/1995 |
| JP | 8-222491 A | 8/1996 |
| JP | 8-267668 A | 10/1996 |
| JP | 2000-12492 A | 1/2000 |
| JP | 2001-44144 A | 2/2001 |
| JP | 2001-217213 A | 8/2001 |
| JP | 2002-75940 A | 3/2002 |
| JP | 2002-203821 A | 7/2002 |

OTHER PUBLICATIONS

Taiwanese Notice of Refusal and English translation thereof mailed Feb. 1, 2005 in corresponding Taiwanese application No. 093105391.

* cited by examiner

*Primary Examiner*—David Nelms
*Assistant Examiner*—Dao H. Nguyen
(74) *Attorney, Agent, or Firm*—Nixon & Vanderhye, P.C.

(57) ABSTRACT

A fabrication method of a semiconductor device according to the present invention includes the steps of: bonding a reinforcing plate with a front surface of a semiconductor wafer via a reinforcing plate, the reinforcing plate having holes and the semiconductor wafer bearing semiconductor devices; grinding a back surface of the semiconductor wafer; and detaching the reinforcing plate from the semiconductor wafer by injecting a solvent for dissolving an adhesive layer into the holes and by allowing the solvent to permeate through the adhesive layer. The method enables the reinforcing plate to be quickly detached from the semiconductor wafer without causing defects, such as bending and cracking, in the semiconductor wafer after the reinforcing plate is used to grind the semiconductor wafer.

9 Claims, 6 Drawing Sheets

FIG. 6 (a) Prior Art
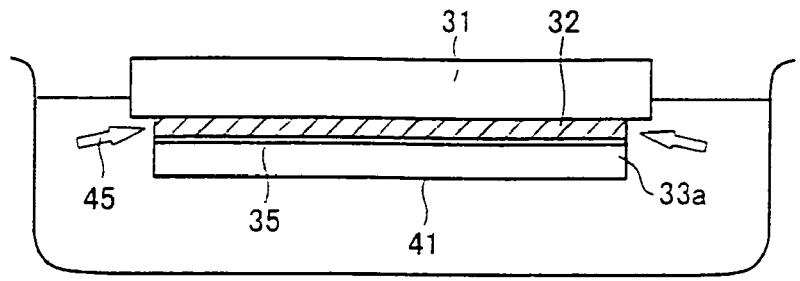
FIG. 6 (b)
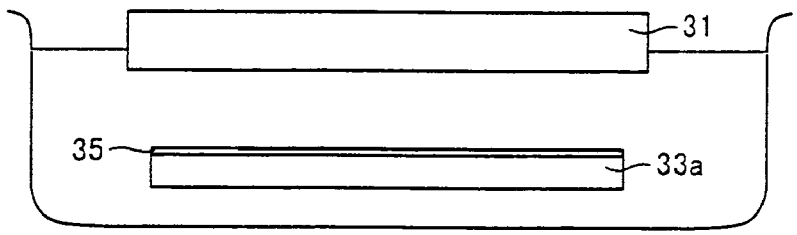
FIG. 7 (a) Prior Art
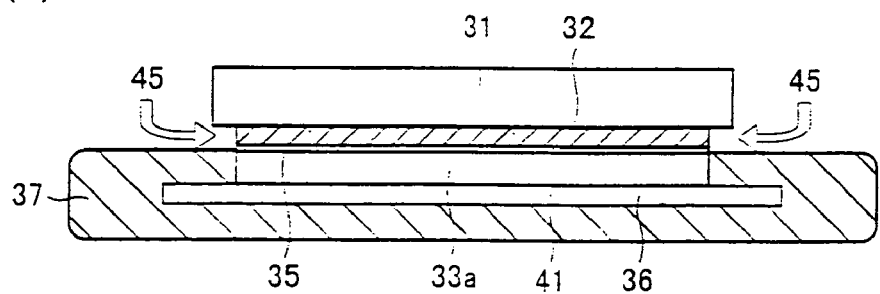
FIG. 7 (b)
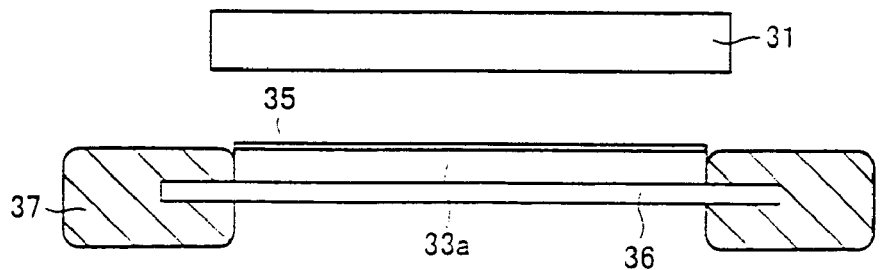

FABRICATION METHOD OF SEMICONDUCTOR DEVICE

This Nonprovisional application claims priority under 35 U.S.C. § 119(a) on patent application Ser. No. 2003/089348 filed in Japan on Mar. 27, 2003, the entire contents of which are hereby incorporated by reference.

FIELD OF THE INVENTION

The present invention relates to fabrication methods of semiconductor devices, in which, for example, a thin layer of semiconductor wafer is prepared and diced to obtain individual semiconductor devices.

BACKGROUND OF THE INVENTION

With a current demand for three-dimensional stacking or high-density packaging of semiconductor devices, it is important nowadays to provide thin semiconductor wafers. One method to provide a thin semiconductor wafer is to lap (grind) the back surface of a semiconductor wafer with a grind stone. While the method is pervasive for it offers good productivity, a drawback of the method is that it may produce micro cracks in the back surface of the semiconductor wafer when the semiconductor wafer is ground, with the result that the bending strength of the semiconductor wafer may be reduced. In order to prevent chipping or cracking that may develop in the semiconductor wafer by an applied external force of grinding, the method requires the semiconductor wafer to be supported (anchored) on a reinforcing member when grinding the back surface of the semiconductor wafer.

The mechanical strength of the semiconductor wafer is weak, and the method requires a "stress-free" technique in which the semiconductor wafer is removed (detached) from the reinforcing member without exerting stress. This is particularly important when a thin semiconductor wafer is provided, in which case the mechanical strength of the semiconductor wafer is even weaker.

In order to grind the semiconductor wafer by anchoring it on a reinforcing member, it is required (1) to anchor the semiconductor wafer on the reinforcing member with such an adhesion force that can withstand back grinding, and (2) to detach the semiconductor wafer from the reinforcing member without exerting stress on the semiconductor wafer that was ground to a reduced thickness.

Conventionally, there have been proposed anchoring and detaching methods for semiconductor wafer and reinforcing member. For example, Japanese Publication for Unexamined Patent Application Nos. 12492/2000 (Tokukai 2000-12492, published on Jan. 14, 2000), and 44144/2001 (Tokukai 2001-44144, published on Feb. 16, 2001) disclose methods in which a UV curable adhesive is used for the bonding, and a reinforcing member is detached by reducing the adhesion force by irradiation of UV light. In another method, a thermoplastic adhesive is used for the bonding, and the reinforcing member is detached by softening the adhesive by applied high-temperature heat after grinding, as disclosed in Japanese Publication for Unexamined Patent Application Nos. 217213/2001 (Tokukai 2001-217213, published on Aug. 10, 2001), 203821/2002 (Tokukai 2002-203821, published on Jul. 19, 2002), and 80938/1994 (Tokukaihei 6-80938, published on Mar. 22, 1994), for example.

In all of these methods, the back surface of the semiconductor wafer is ground while maintaining a strong adhesion force between the semiconductor wafer and reinforcing member. After back grinding, the adhesion force is reduced by irradiation of UV light or application of high-temperature heat, so as to mechanically detach the reinforcing member from the semiconductor wafer while an adhesive layer is still attached on the reinforcing member.

Referring to FIG. 5, the following describes a conventional fabrication method of a thin semiconductor device using a UV curable adhesive.

First, a reinforcing plate 31 is attached via a UV adhesive layer 32, on a front surface 35 of a semiconductor wafer 33 bearing semiconductor devices (not shown) (FIG. 5(a)). Then, while reinforcing the semiconductor wafer 33 with the reinforcing plate 31, a back surface (portion 33b) of the semiconductor wafer 33 is ground to provide a semiconductor wafer 33a of a reduced thickness (FIG. 5(b)). Thereafter, a dicing tape 36 is attached on the back surface (ground surface 41) of the semiconductor wafer 33a (FIG. 5(c)). The dicing tape 36 serves as a support when dividing the semiconductor wafer 33a into individual semiconductor devices.

Next, by irradiation of UV light 46 on the UV adhesive layer 32, the adhesion force of the UV adhesive layer 32 is reduced (FIG. 5(d)). In the next step, a mechanical force is applied on the reinforcing plate 31 to detach the reinforcing plate 31 and the adhesive layer 32 from the semiconductor wafer 33a (FIG. 5(e)). Finally, the semiconductor wafer 33a is diced into individual pieces of semiconductor device 30 (FIG. 5(f)), and the divided pieces of semiconductor device 30 are picked up (FIG. 5(g)).

Note that, the method using a thermoplastic adhesive follows the same steps, except that the method uses a thermoplastic adhesive instead of a UV curable adhesive (adhesive layer 32), and that high-temperature heat is applied instead of UV light.

While the method using a UV curable adhesive can reduce the adhesion force of the adhesive to a certain point by irradiation of UV light, it cannot completely remove the adhesive sticking to the front surface of the semiconductor wafer 33a. That is, a remaining adhesive retains its adhesion force on the front surface of the semiconductor wafer 33a. In this case, when a mechanical force is applied on the reinforcing member 31 to detach the reinforcing member 31 from the semiconductor wafer 33a, the adhesive remaining on the front surface of the semiconductor wafer 33a transmits the mechanical force to the semiconductor wafer 33a, pulling the semiconductor wafer 33a.

In the step of detaching the reinforcing plate 31 from the semiconductor wafer 33a, the reinforcing plate 31 is attached on the back surface of the semiconductor wafer 33a (see FIG. 5(e)). The dicing tape 36 is not rigid, and the adhesion between the dicing tape 36 and the semiconductor wafer 33a is not strong enough to retain the state (planar shape) of the semiconductor wafer 33a against the mechanical force that transmits to the semiconductor wafer 33a (force pulling the semiconductor wafer 33a). This may cause cracking in the semiconductor wafer 33a when detaching the reinforcing plate 31 from the semiconductor wafer 33a. As one can imagine, the problem of cracking becomes even more serious when the thickness or size of the semiconductor wafer 33a is increased.

Another drawback of the conventional methods is that the reinforcing plate 31 requires a material that transmits UV light 46. That is, the material of the reinforcing plate 31 is limited to UV transmissive materials.

The methods using a thermoplastic adhesive may also cause the problem of cracking in the semiconductor wafer 33a when the reinforcing plate 31 is detached from the semiconductor wafer 33a.

Further, owning to the fact that the semiconductor wafer 33a and the reinforcing plate 31 have different coefficients of thermal expansion, the semiconductor wafer 33a may be fractured when high-temperature heat (for example, above 100° C.) is applied to reduce the adhesion force of the adhesive.

In order to prevent these problems, Japanese Publication for Unexamined Patent Application No. 222491/1996 (Tokukaihei 8-222491, published on Aug. 30, 1996) discloses a method in which an adhesive layer is dissolved to detach the reinforcing plate.

The method (may be referred to as "conventional method" hereinafter) dissolves the adhesive layer in the manner shown in FIG. 6(a) and FIG. 6(b). First, the semiconductor wafer 33a and adhesive layer 32 are immersed in a solvent 45 that can dissolve the adhesive (FIG. 6(a)). The solvent 45 dissolves the adhesive layer 32, and the reinforcing plate 31 is detached (FIG. 6(b)). In this method, the reinforcing plate 31 is detached from the semiconductor wafer 33a after the adhesive layer 32 is removed. Accordingly, no mechanical force is exerted on the semiconductor wafer 33a when the reinforcing plate 31 is detached.

In the conventional method, however, the reinforcing plate 31 is detached while the adhesive layer 32 and the semiconductor wafer 33a are immersed in the solvent 45. That is, the reinforcing plate 31 needs to be detached without a support, such as a dicing tape, on a back surface 41 of the semiconductor wafer 33a (see FIG. 6(a)). More specifically, the semiconductor wafer 33a, with the reinforcing plate 31 detached and with its thickness reduced, is not supported on a support. This makes it extremely difficult to handle the semiconductor wafer 33a without causing cracking or chipping.

As a countermeasure, a support, such as a dicing tape, may be attached on the semiconductor wafer 33a after the reinforcing plate 31 is detached. However, in this case, the semiconductor wafer 33a may be cracked or bent when the dicing tape is pressed against the back surface of the semiconductor wafer 33a.

An alternative method is shown in FIG. 7(a) and FIG. 7(b).

As illustrated in FIG. 7(a), after grinding the semiconductor wafer 33, a dicing tape 36 is attached on a back surface 41 of the semiconductor wafer 33a with a reinforcing plate 31 attached on a front surface 35 of the semiconductor wafer 33a. Then, with a support jig 37 covering the dicing tape 36 and the side surface of the semiconductor wafer 33a, a solvent 45 is allowed to gradually permeate through an adhesive layer 32 from the sides to inside the adhesive layer 32, without touching the dicing tape 36. The solvent 45 dissolves the adhesive layer 32, and the reinforcing plate 31 is detached, as shown in FIG. 7(b). In this manner, the method enables the reinforcing plate 31 to be detached from the semiconductor wafer 33a, with the dicing tape 36 attached on the semiconductor wafer 33a.

The method requires the solvent 45 to gradually permeate through the adhesive layer 32 from the sides to inside the adhesive layer 32. This is problematic in that it takes time to completely dissolve the adhesive layer 32 and thereby enables the reinforcing plate 31 to be detached from the semiconductor wafer 33a.

Another drawback is that the adhesive layer 32 is not dissolved uniformly when the adhesive layer 32 is gradually dissolved from the periphery. This produces uneven stress over the semiconductor wafer 33a supported by the reinforcing plate 31 and the support jig 37, causing the semiconductor wafer 33a to bend or crack.

SUMMARY OF THE INVENTION

The present invention was made in view of the foregoing problems, and it is an object of the present invention to provide a fabrication method of a semiconductor device, whereby a reinforcing material is quickly detached from a semiconductor wafer without bending or cracking the semiconductor wafer, when the reinforcing material is used to grind the semiconductor wafer.

In order to achieve this object, a method for fabricating a semiconductor device according to the present invention includes: a reinforcing step of bonding a reinforcing plate, via an adhesive layer, on a front surface of a semiconductor wafer bearing one or more semiconductor devices; a grinding step of grinding a back surface of the semiconductor wafer; and a detaching step of detaching the reinforcing plate from the semiconductor wafer, wherein the reinforcing plate has an injection path that connects a surface in contact with the adhesive layer with a surface other than the surface in contact with the adhesive layer, and wherein, in the detaching step, a solvent for dissolving the adhesive layer is injected through the injection path of the reinforcing plate, so as to permeate the adhesive layer and detach the reinforcing plate from the semiconductor wafer.

The injection path (hole or groove) of the reinforcing plate connects the interface of the reinforcing plate and the adhesive layer (the interface being a back surface of the reinforcing plate) with a front surface or side surface of the reinforcing plate. The front surface of the semiconductor wafer bears one or more semiconductor devices, and the back surface of the semiconductor wafer is subjected to grinding. The front surface of the semiconductor wafer is bonded with the reinforcing plate via the adhesive layer. The reinforcing plate enables the back surface of the semiconductor wafer to be ground while reinforcing the semiconductor wafer. In this way, a thin semiconductor wafer can be realized without causing cracking or bending.

In the detaching step, a solvent for dissolving the adhesive layer is injected through the injection path, so that the solvent directly permeates the interface of the reinforcing plate and the adhesive layer. This enables the adhesive layer to be dissolved in a short period of time, thereby quickly eliminating the adhesion force acting between the reinforcing plate and the semiconductor wafer. Thus, with the method for the present invention, the reinforcing plate can be detached from the semiconductor wafer more quickly than with a conventional method in which the adhesive layer is dissolved from the sides.

Further, because no mechanical stress is exerted on the semiconductor wafer when it is detached, the semiconductor wafer can be detached from the reinforcing plate without causing cracking, chipping, or bending.

Further, because the method prevents the solvent from touching the dicing tape, the method is also advantageous in, for example, attaching a dicing tape on the back surface of the semiconductor wafer when the dicing tape is used to support the semiconductor wafer when it is separated. Thus, with a fabrication method of the present invention, the detaching step can be carried out without removing the dicing tape.

For a fuller understanding of the nature and advantages of the invention, reference should be made to the ensuing detailed description taken in conjunction with the accompanying drawings.

BRIEF DESCRIPTION OF THE DRAWINGS

FIG. 1(a) through FIG. 1(g) are views illustrating fabrication steps of a semiconductor device in a First Embodiment of the present invention, in which FIG. 1(a) illustrates a reinforcing step, FIG. 1(b) illustrates a grinding step, FIG. 1(c) illustrates a bonding step, FIGS. 1(d) and 1(e) illustrate a detaching step, and FIGS. 1(f) and 1(g) illustrate a dicing step.

FIG. 3(a) through FIG. 3(g) are views illustrating fabrication steps of a semiconductor device in a Second Embodiment of the present invention, in which FIG. 3(a) illustrates a reinforcing step, FIG. 3(b) illustrates a grinding step, FIG. 3(c) illustrates a bonding step, FIGS. 3(d) and 3(e) illustrate a detaching step, and FIGS. 3(f) and 3(g) illustrate a dicing step.

FIG. 5(a) through FIG. 5(g) are views illustrating conventional fabrication steps of a semiconductor device, in which FIG. 5(a) illustrates a reinforcing step, FIG. 5(b) illustrates a grinding step, FIG. 5(c) illustrates a bonding step, FIGS. 5(d) and 5(e) illustrate a detaching step, and FIGS. 5(f) and 5(g) illustrate a dicing step.

FIG. 6(a) and FIG. 6(b) are views illustrating a detaching step in a conventional fabrication method of a semiconductor device.

FIG. 7(a) and FIG. 7(b) are views illustrating a detaching step in another conventional fabrication method of a semiconductor device.

DESCRIPTION OF THE EMBODIMENTS

[First Embodiment]

Figure 1:
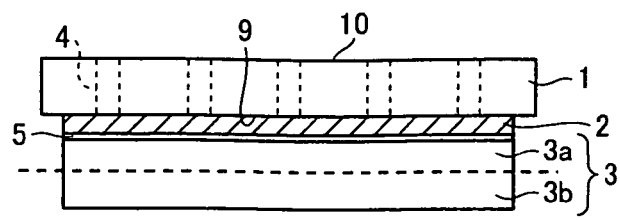
Figure 1:
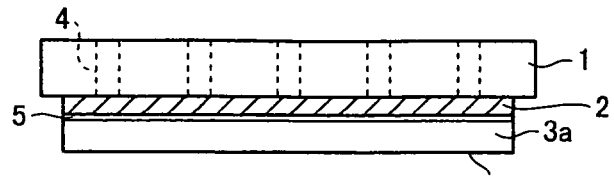
Figure 1:
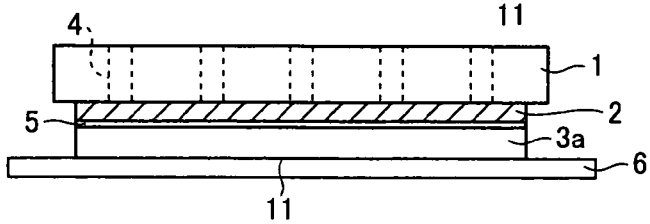
Figure 1:
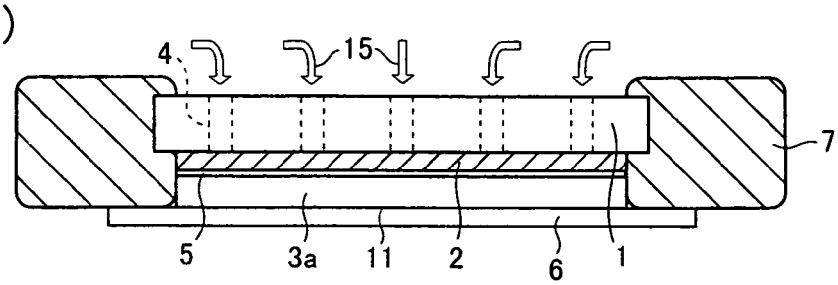
Figure 1:
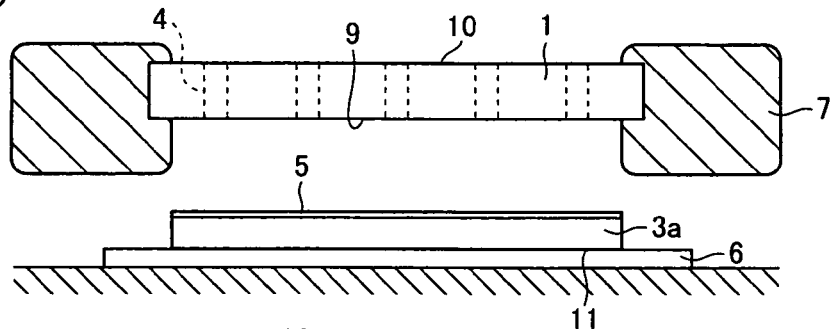
Figure 1:
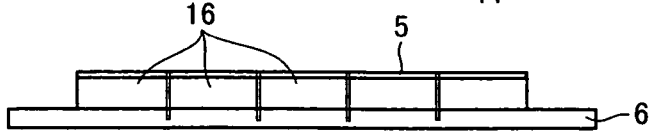
Figure 1:
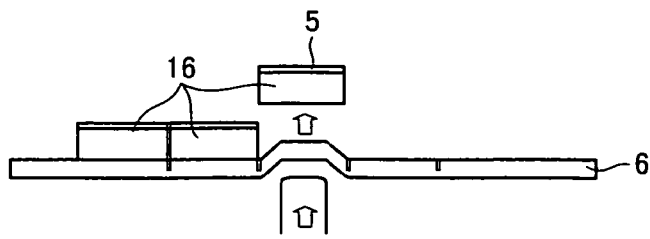

Referring to FIGS. 1 (a) through 1(g), and FIG. 2, a First Embodiment of the present invention is described below.

The present embodiment provides the following five fabrication steps (Step 1 (S1) through Step 5 (S5)). In Step 1, a reinforcing plate 1 and a semiconductor wafer 3 (3a, 3b) are bonded with each other with an adhesive layer 2 interposed in between (reinforcing step, FIG. 1(a)). In Step 2, the semiconductor wafer 3b is ground (grinding step, FIG. 1(b)). In Step 3, a dicing tape 6 is attached on a back surface 11 of the semiconductor wafer 3a (bonding step, FIG. 1(c)). In step 4, a solvent 15 is injected through holes 4 of the reinforcing plate 1, so as tot separate the semiconductor wafer 3a from the reinforcing plate 1 (detaching step, FIGS. 1(d) and 1(e)). In step 5, the semiconductor wafer 3a is diced after it is separated from the reinforcing plate 1, and individual pieces of semiconductor device 16 are picked up (dicing step, FIGS. 1(g) and 1(f)).

Figure 2:
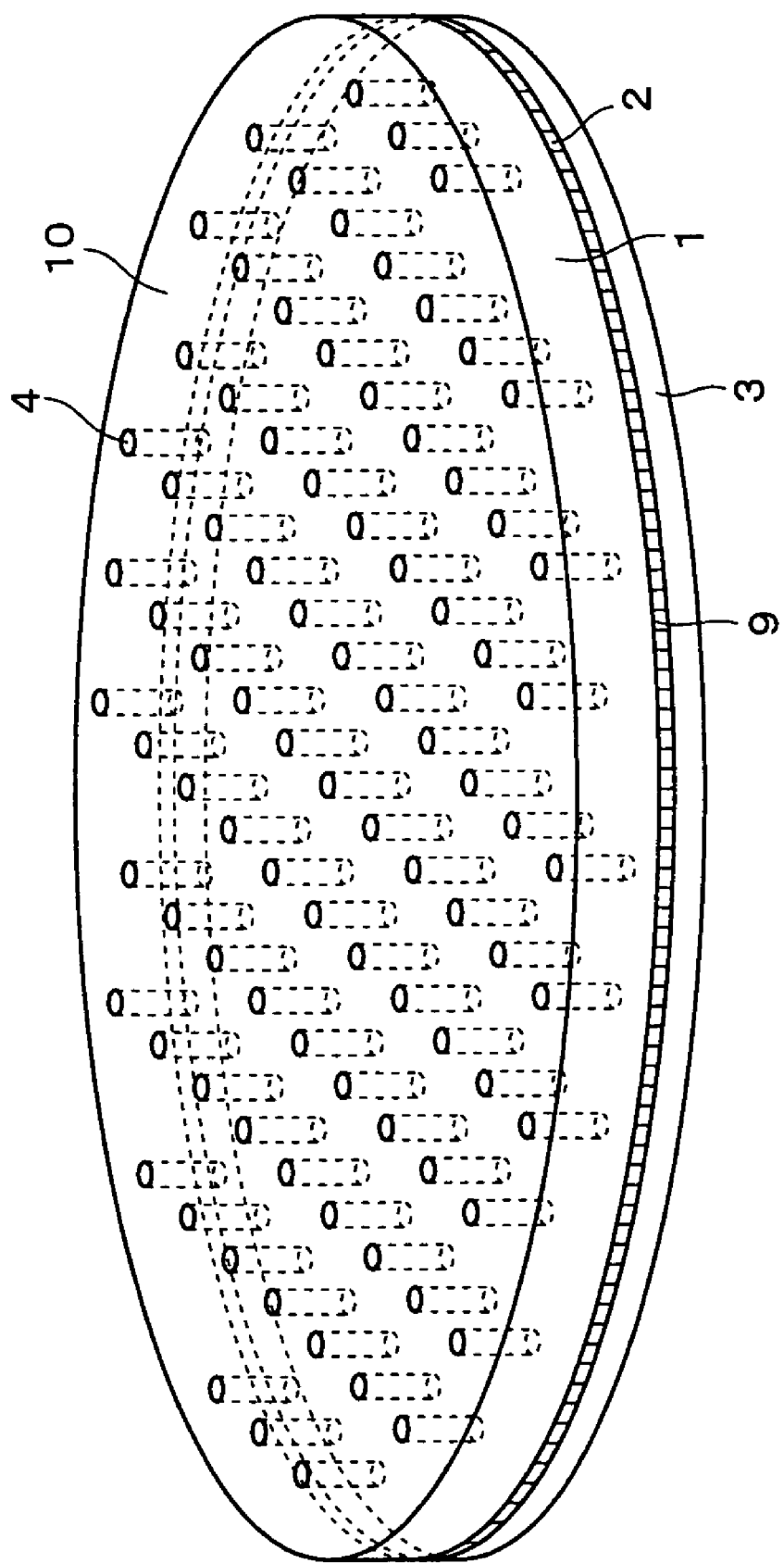
FIG. 2 is a perspective view according to the First Embodiment of the invention, illustrating a state in which a reinforcing plate with holes is bonded with a semiconductor wafer.

FIG. 2 illustrates a state in the reinforcing step (S1), in which the reinforcing plate 1 and the semiconductor wafer 3a are bonded with each other via the adhesive layer 2. As shown in FIG. 2, the reinforcing plate 1 has a plurality of holes 4 through which the solvent is injected to dissolve the adhesive layer 2. The holes 4 are scattered over the entire surface of the reinforcing plate 1, penetrating through the reinforcing plate 1 from a front surface 10 to a back surface 9. Preferably, the holes 4 are evenly scattered (at regular intervals).

This is preferable for the advantage it offers in the detaching step (S4, see FIGS. 1(d) and 1(e)). Namely, when the holes 4 are regularly (evenly) spaced over the entire surface of the reinforcing plate 1, the solvent 15 can pass through the holes 4 to directly and evenly permeate the interface of the reinforcing plate 1 and the adhesive layer 2. This enables the adhesive layer 2 to be dissolved in a short period of time, thereby quickly eliminating the adhesion force acting between the reinforcing plate 1 and the semiconductor wafer 3a. That is, the reinforcing plate 1 can be quickly detached from the semiconductor wafer 3a.

Referring to FIGS. 1(a) through 1(g), the respective fabrication steps are described below in more detail.

First, as illustrated in FIG. 1(a), the reinforcing plate 1 and the semiconductor wafer 3 (3a, 3b) are bonded with each other, with the adhesive layer 2 interposed in between (reinforcing step (S1)). A multiplicity of semiconductor devices (not shown) makes up a front surface 5 of the semiconductor wafer 3. The reinforcing plate 1 has evenly (regularly) spaced holes 4 that connect the front surface 10 and back surface 9 of the reinforcing plate 1. The type of adhesive used for the adhesive layer 2 is such that it provides strong adhesion that can withstand the mechanical stress of grinding when a back surface 11 of the semiconductor wafer 3a is ground in the grinding step (S2).

Next, in order to reduce the thickness of the semiconductor wafer 3 (3a, 3b), the back surface 11 of the semiconductor wafer 3 is ground to remove the portion 3b of the semiconductor wafer 3 (grinding step (S2)), as shown in FIG. 1(b). Here, the mechanical stress of grinding (vibration, etc.) is absorbed by the reinforcing plate 1 tightly attached on the semiconductor wafer 3a, thereby preventing the semiconductor wafer 3a from being cracked or bent. The semiconductor wafer 3a so formed has a thickness of about 50 to 100 μm.

In the next step, the dicing tape 6 is bonded on the back surface 11 of the semiconductor wafer 3a (bonding step (S3)), as shown in FIG. 1(c). The dicing tape 6 is required when dicing the semiconductor wafer 3a into individual pieces of semiconductor device (not shown).

Next, as shown in FIG. 1(d), a support jig 7 is fastened on the side surface of the semiconductor wafer 3a. Here, the support jig 7 also surrounds other members used in the fabrication method. The support jig 7 is a ring and is in contact with the sides of the reinforcing plate 1, the adhesive layer 2, and the semiconductor wafer 3a. The support jig 7 serves to support these members, and to prevent the solvent 15 that has dissolved the adhesive layer 2 from leaking outside (particularly to the dicing tape 6).

The solvent 15 is for dissolving the adhesive layer 2. When the solvent 15 is injected through the holes 4, it uniformly (evenly) permeates the interface of the reinforcing plate 1 and the adhesive layer 2, and thereby quickly dissolves the adhesive layer 2. As a result, the semiconductor wafer 3a is quickly detached from the reinforcing plate 1 (detaching step (S4)), as shown in FIG. 1(e). Here, the semiconductor wafer 3a may be allowed to detach itself from the reinforcing plate 1 by the force of gravity, or by removing the support jig 7 from the semiconductor wafer 3a.

In the dicing step (S5), the semiconductor wafer 3a detached from the reinforcing plate 1 is diced (divided into individual semiconductor chips) as shown in FIG. 1(f), using the dicing tape 6 as a support, and the divided pieces of semiconductor device 16 are picked up as shown in FIG. 1(g). For dicing, any conventional dicing technique may be used.

The semiconductor device 16 so fabricated by the foregoing fabrication method has a thickness of about 50 to 150 μm, which is thin enough to meet the requirements of thin semiconductor devices.

[Second Embodiment]

Referring to FIG. 3(a) through FIG. 3(g), and FIG. 4, a Second Embodiment of the present invention is described below. FIG. 3(a) through FIG. 3(g) illustrate fabrication steps of the present embodiment.

Figure 3:
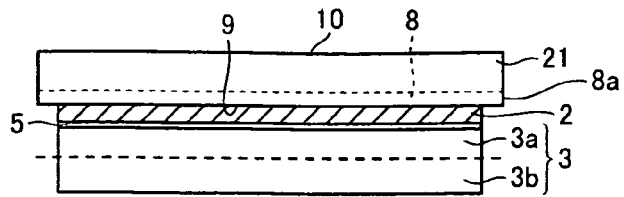
Figure 3:
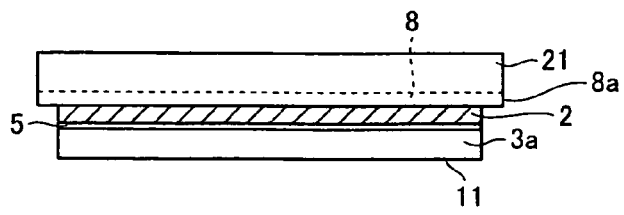
Figure 3:
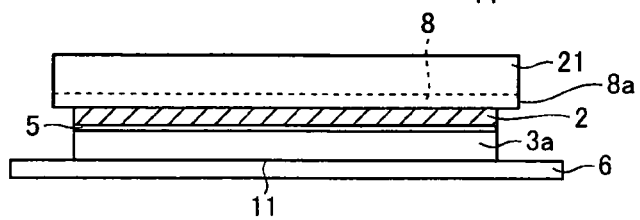
Figure 3:
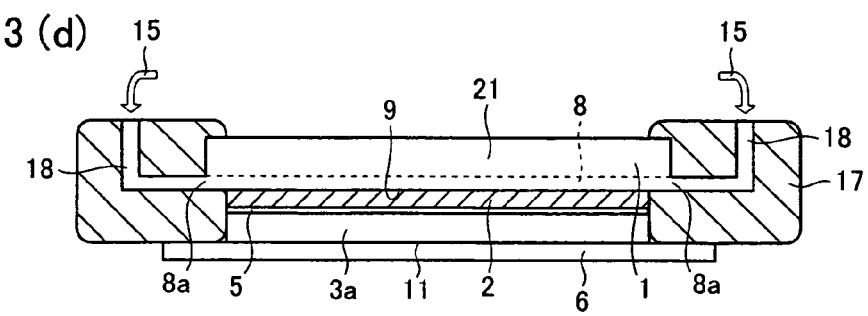
Figure 3:
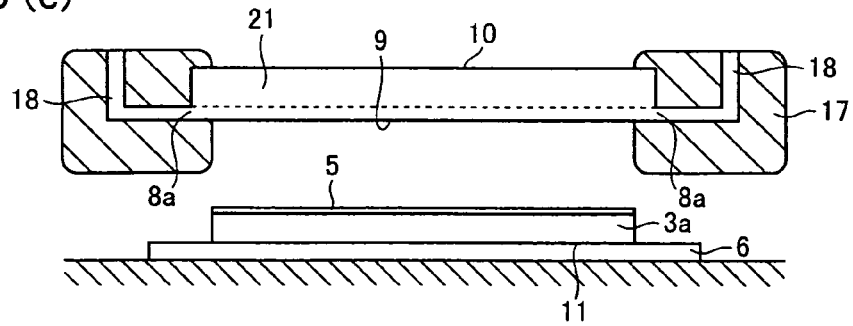
Figure 3:
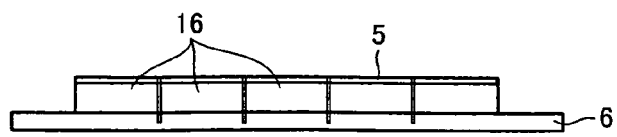
Figure 3:
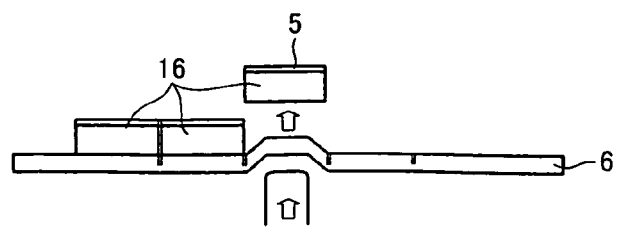

First, as illustrated in FIG. 3(a), a reinforcing plate 21 and a semiconductor wafer 3 (3a, 3b) are bonded with each other, with an adhesive layer 2 interposed in between (reinforcing step (S1)). A multiplicity of semiconductor devices (not shown) makes up a front surface 5 of the semiconductor wafer 3. The reinforcing plate 21 has a back surface 9 (facing the semiconductor wafer 3 via the adhesive layer 2) with narrow grooves 8, as illustrated in FIG. 4.

Figure 4:
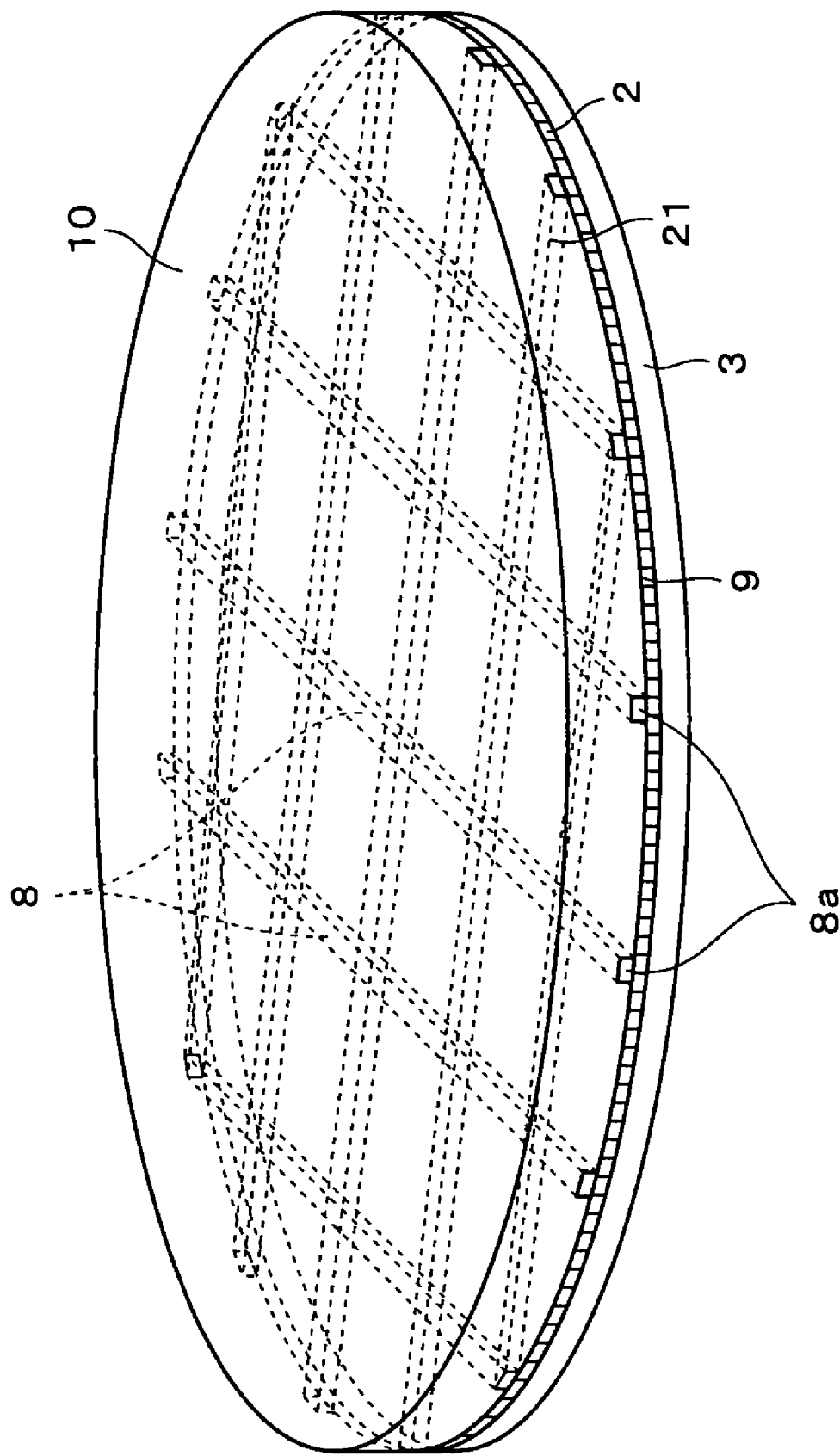
FIG. 4 is a perspective view according to the Second Embodiment of the invention, illustrating a state in which a reinforcing plate with narrow grooves is bonded with a semiconductor wafer.
Figure 5:
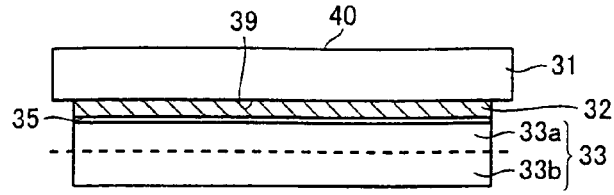
Figure 5:
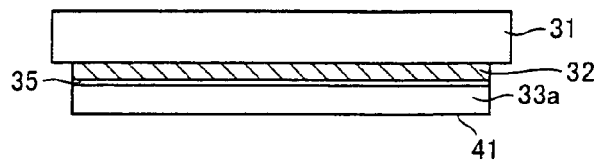
Figure 5:
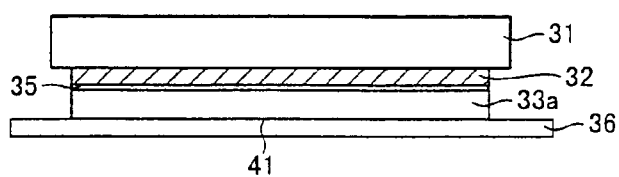
Figure 5:
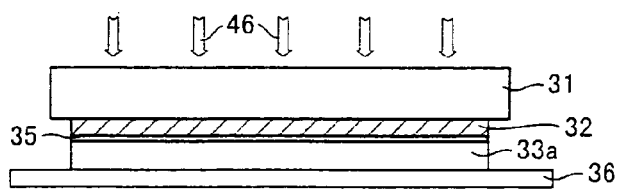
Figure 5:
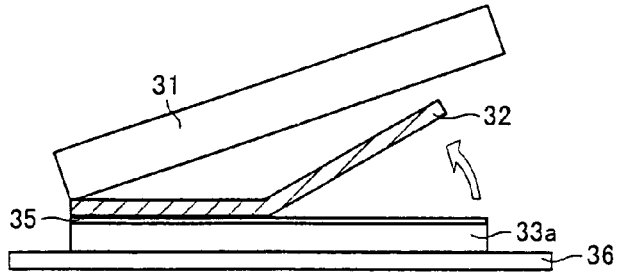
Figure 5:
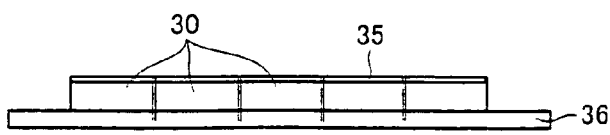
Figure 5:
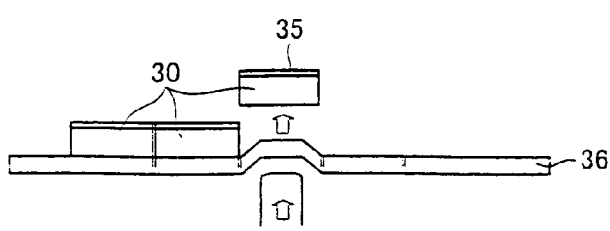

As shown in FIG. 4, the narrow grooves 8 are provided in the form of a lattice throughout the back surface 9 of the reinforcing plate 21. Each narrow groove 8 extends to the side surface of the reinforcing plate 21, and has ends 8a (on the side surface of the reinforcing plate 1) that constitute an opening (narrow groove opening) for the solvent. The solvent is injected through the opening of the narrow groove 8 to dissolve the adhesive layer 2 in the subsequent detaching process. The type of adhesive used for the adhesive layer 2 is such that it provides strong adhesion that can withstand the mechanical stress of grinding when the back surface 11 of the semiconductor wafer 3a is ground in the grinding step (S2).

Next, in order to reduce the thickness of the semiconductor wafer 3 (3a, 3b), the back surface 11 is ground to remove the portion 3b of the semiconductor wafer 3. (grinding step (S2)), as shown in FIG. 3(b). Here, the mechanical stress of grinding (vibration, etc.) is absorbed by the reinforcing plate 21 tightly attached on the semiconductor wafer 3a, thereby preventing the semiconductor wafer 3a from being cracked or bent. The semiconductor wafer 3a so formed has a thickness of about 50 to 150 μm.

In the next step, a dicing tape 6 is bonded on the back surface 11 of the semiconductor wafer 3a (bonding step (S3)), as shown in FIG. 3(c). The dicing tape 6 is required when dicing the semiconductor wafer 3a into individual pieces of semiconductor device (not shown).

Next, as shown in FIG. 3(d), a support jig 17 is fastened on the side surface of the semiconductor wafer 3a. Here, the support jig 17 also surrounds other members used in the fabrication method. The support jig 17 is a ring and is in contact with the sides of the reinforcing plate 21, the adhesive layer 2, and the semiconductor wafer 3a. The support jig 17 serves to support these members, and to prevent the solvent 15 that has dissolved the adhesive layer 2 from leaking outside (particularly to the dicing tape 6). Further, as illustrated in FIG. 3(d), the support jig 17 has an injection opening 18, so that the solvent 15 does not touch the dicing tape 6 when it is injected.

The solvent 15 is for dissolving the adhesive that forms the adhesive layer 2, and it is injected through the injection opening 18. The solvent 15 injected through the injection opening 18 flows into the narrow grooves 8 of the lattice through the narrow groove opening 8a, and uniformly (evenly) permeates the interface of the reinforcing plate 21 and the adhesive layer 2, thereby quickly dissolving the adhesive layer 2. As a result, the semiconductor wafer 3a is quickly detached from the reinforcing plate 21 (detaching step (S4)), as shown in FIG. 3(e). Here, the semiconductor wafer 3a may be allowed to detach itself from the reinforcing plate 21 either by the force of gravity, or by removing the support jig 17 from the semiconductor wafer 3a.

In the dicing step (S5), the semiconductor wafer 3a detached from the reinforcing plate 21 is diced (divided into individual semiconductor chips) as shown in FIG. 3(f), using the dicing tape 6 as a support, and the divided pieces of semiconductor device 16 are picked up as shown in FIG. 3(g). For dicing, any conventional dicing technique may be used.

The semiconductor device 16 so fabricated by the foregoing fabrication method has a thickness of about 50 to 150 μm, which is thin enough to meet the requirements of thin semiconductor devices.

The narrow grooves 8 on the back surface 9 of the reinforcing plate 21 are provided in the form of a lattice in the present embodiment. However, the narrow grooves 8 are not just limited to the lattice pattern. For example, the narrow grooves 8 may be provided to radiate outward from the center toward the side of the reinforcing plate 21.

In the foregoing First and Second Embodiments, the injection path for the solvent 15 is realized by the holes 4 through the reinforcing plate (see FIG. 2 for example) or the narrow grooves 8 on the reinforcing plate (see FIG. 4 for example). However, the injection path is not just limited thereto, and it may be realized in any form provided that the injection path provides a passageway from the outer face (front surface, side surface) to the back surface (the surface in contact with the adhesive layer 2) of the reinforcing plate, and that the solvent 15 is injected to the adhesive layer 2. For example, the injection path may be a channel that connects a side surface of the reinforcing plate to the back surface by bending inside the reinforcing plate. Alternatively, the injection path may be realized by a combination of the hole and the narrow groove, with the end of the hole opening into the narrow groove on the back surface of the reinforcing plate.

As described, in preferred embodiments of the present invention, the solvent 15 for dissolving the adhesive layer 2 is injected through the injection path of the reinforcing plate (for example, holes 4 in FIG. 2, and narrow grooves 8 in FIG. 4). This enables the solvent 15 to directly and evenly permeate the adhesive layer 2, thus quickly dissolving the adhesive layer 2. As a result, the detaching step (S4) can be carried out in a considerably short period of time. This is particularly advantageous for a large-sized semiconductor wafer 3a with a proportionally increased area for the adhesive layer 2. In this case, by evenly providing the holes 4 or narrow grooves 8 over the increased area, the solvent 15 is able to quickly permeate the entire area of the adhesive layer 2 to dissolve the adhesive layer 2.

Further, because no mechanical stress is exerted on the semiconductor wafer 3a when detaching the reinforcing plate from the semiconductor wafer 3a, the semiconductor wafer 3a is protected from defects such as cracking or bending.

Further, the foregoing fabrication method does not use ultraviolet light or heat to detach the reinforcing plate. This affords more freedom in terms of a selection of material for the reinforcing plate. The method is also advantageous when the adhesive layer 2 is made of a material that cannot withstand heat.

Further, because the adhesive in the adhesive layer 2 is dissolved uniformly, the problem of cracking or bending can be prevented that occurs when the adhesive layer 2 is unevenly dissolved and when uneven stress is applied on the semiconductor wafer 3a.

Further, the solvent 15 permeates the adhesive layer 2 through the holes 4 or narrow grooves 8, and the solvent 15 is unlikely to touch the dicing tape 6 attached on the back surface 11 of the semiconductor wafer 3a. This enables the dicing tape 6 to be made of a material with poor solvent resistance.

It should be appreciated that the present invention is not just limited to the foregoing embodiments, and the invention may be varied in many ways within the scope of the claims. Further, the technical means described in the foregoing embodiments may be suitably combined to constitute a new embodiment, and all such combinations of the technical means are intended to fall within the scope of the present invention.

As described, a method for fabricating a semiconductor device according to the present invention includes: a reinforcing step of bonding a reinforcing plate, via an adhesive layer, on a front surface of a semiconductor wafer bearing one or more semiconductor devices, the reinforcing layer having one or more holes that connect a front surface and a back surface of the reinforcing layer; a grinding step of grinding a back surface of the semiconductor wafer; and a detaching step of detaching the reinforcing plate from the semiconductor wafer by injecting Through the holes a solvent for dissolving the adhesive layer.

The front surface of the semiconductor wafer bears one or more semiconductor devices, and the back surface of the semiconductor wafer is subjected to grinding. The front surface of the semiconductor wafer is bonded with the reinforcing plate via the adhesive layer. The reinforcing plate reinforces the semiconductor wafer when the back surface of the semiconductor wafer is ground. In this way, a thin semiconductor wafer can be achieved without causing cracking or bending.

In the detaching step, a solvent for dissolving the adhesive layer is injected through the holes, so that the solvent directly permeates the interface of the reinforcing plate and the adhesive layer. This enables the adhesive layer to be dissolved in a short period of time, thereby quickly eliminating the adhesion force acting between the reinforcing plate and the semiconductor wafer. Thus, with the method of the present invention, the reinforcing plate can be detached from the semiconductor wafer more quickly than with a conventional method in which the adhesive layer is dissolved from the sides.

Further, because no mechanical stress is exerted on the semiconductor wafer when it is detached, the semiconductor wafer can be detached from the reinforcing plate without causing cracking, chipping, or bending.

As described, a method for fabricating a semiconductor device according to the present invention includes: a reinforcing step of bonding a reinforcing plate, via an adhesive layer, with a semiconductor wafer bearing a semiconductor device on its front surface, the reinforcing plate having a surface with one or more grooves that extend to a side surface of the reinforcing plate, wherein the reinforcing plate is bonded with the semiconductor wafer so that the surface with the grooves is in contact with the front surface of the semiconductor wafer; a grinding step of grinding a back surface of the semiconductor wafer; and a detaching step of detaching the reinforcing plate from the front surface of the semiconductor wafer by injecting into the grooves a solvent for dissolving the adhesive layer.

The reinforcing plate has a surface with one or more grooves that extend to a side surface of the reinforcing plate. The front surface of the semiconductor wafer bears one or more semiconductor devices, and the back surface of the semiconductor wafer is subjected to grinding. The semiconductor wafer is bonded with the reinforcing plate via the adhesive layer, with the front surface of the semiconductor wafer facing the surface of the reinforcing plate with one or more grooves. The reinforcing plate reinforces the semiconductor wafer when the back surface of the semiconductor wafer is ground. In this way, a thin semiconductor wafer can be achieved without causing cracking or bending.

In the detaching step, a solvent for dissolving the adhesive layer is injected into an end of the groove (an opening on a side surface of the reinforcing plate), so that the solvent directly permeates the interface of the reinforcing plate and the adhesive layer. This enables the adhesive layer to be dissolved in a short period of time, thereby quickly eliminating the adhesion force acting between the reinforcing plate and the semiconductor wafer. Thus, with the method of the present invention, the reinforcing plate can be detached from the semiconductor wafer more quickly than with a conventional method in which the adhesive layer is dissolved from the sides.

Further, because no mechanical stress is exerted on the semiconductor wafer when it is detached, the semiconductor wafer can be detached from the reinforcing plate without causing cracking, chipping, or bending.

In the method for fabricating a semiconductor device according to the present invention, the holes are scattered over the reinforcing plate.

With the holes scattered over the reinforcing plate, the solvent injected through the holes can more quickly dissolve the adhesive layer. This is particularly advantageous for a large-sized semiconductor wafer with a proportionally increased area for the adhesive layer. In this case, by scattering the holes over the increased area, the solvent can more quickly permeate and dissolve the entire area of the adhesive layer.

Further, with the scattered holes, the adhesive layer can be dissolved uniformly. By thus dissolving the adhesive layer without creating an uneven distribution in the adhesive layer, the problem of cracking or bending can be prevented that occurs when the adhesive layer is unevenly dissolved.

In the method for fabricating a semiconductor device according to the present invention, the grooves are scattered (in the form of a lattice, for example) over a surface of the adhesive layer.

With the grooves scattered over a surface of the reinforcing plate, the solvent injected through the grooves can more quickly dissolve the adhesive layer. This is particularly advantageous for a large-sized semiconductor wafer with a proportionally increased area for the adhesive layer. In this case, by scattering the grooves over the increased area, the solvent can more quickly permeate and dissolve the entire area of the adhesive layer.

Further, with the scattered grooves, the adhesive layer can be dissolved substantially uniformly. Because the adhesive layer is uniformly dissolved without creating an uneven distribution in the adhesive layer, the problem of cracking or bending can be prevented that occurs when the adhesive layer is unevenly dissolved.

As described, a method for fabricating a semiconductor device according to the present invention includes: a reinforcing step of bonding a reinforcing plate, via an adhesive layer, on a front surface of a semiconductor wafer bearing one or more semiconductor devices, the reinforcing layer having one or more holes that connect a front surface and a back surface of the reinforcing layer; a grinding step of grinding a back surface of the semiconductor wafer; a bonding step of bonding a dicing tape on the back surface of the semiconductor wafer after grinding; a detaching step of detaching the reinforcing plate from the semiconductor wafer by injecting through the holes a solvent for dissolving the adhesive layer; and a dicing step of dicing the semiconductor wafer so as to separate the semiconductor devices into individual pieces.

The dicing tape is used in the dicing step to support the semiconductor wafer.

In the detaching step, a solvent for dissolving the adhesive layer is injected through the holes, so that the solvent directly permeates the interface of the reinforcing plate and the adhesive layer. This enables the adhesive layer to be dissolved in a short period of time, thereby quickly eliminating the adhesion force acting between the reinforcing plate and the semiconductor wafer. Thus, with the method for the present invention, the reinforcing plate can be detached from the semiconductor wafer more quickly than with a conventional method in which the adhesive layer is dissolved from the sides.

Further, because no mechanical stress is exerted on the semiconductor wafer when it is detached, the semiconductor wafer can be detached from the reinforcing plate without causing cracking, chipping, or bending.

Further, the solvent permeates the adhesive layer through the holes, and the solvent is unlikely to touch the dicing tape attached on the back surface of the semiconductor wafer. This enables the dicing tape to be made of a material with poor solvent resistance.

As described, a method for fabricating a semiconductor device according to the present invention includes: a reinforcing step of bonding a reinforcing plate, via an adhesive layer, with a semiconductor wafer bearing one or more semiconductor devices on its front surface, the reinforcing plate having a surface with one or more grooves that extend to a side surface of the reinforcing plate, wherein the reinforcing plate is bonded with the semiconductor wafer so that the surface with the grooves is in contact with the front surface of the semiconductor wafer; a grinding step of grinding a back surface of the semiconductor wafer; a bonding step of bonding a dicing tape on the back surface of the semiconductor wafer after grinding; a detaching step of detaching the reinforcing plate from the front surface of the semiconductor wafer by injecting into the grooves a solvent for dissolving the adhesive layer; and a dicing step of dicing the semiconductor devices so as to separate the semiconductor devices into individual pieces.

In the detaching step, a solvent for dissolving the adhesive layer is injected through the grooves, so that the solvent directly permeates the interface of the reinforcing plate and the adhesive layer. This enables the adhesive layer to be dissolved in a short period of time, thereby quickly eliminating the adhesion force acting between the reinforcing plate and the semiconductor wafer. Thus, with the method of the present invention, the reinforcing plate can be detached from the semiconductor wafer more quickly than with a conventional method in which the adhesive layer is dissolved from the sides.

Further, because no mechanical stress is exerted on the semiconductor wafer when it is detached, the semiconductor wafer can b& detached from the reinforcing plate without causing cracking, chipping, or bending.

Further, the solvent permeates the adhesive layer through the grooves, and the solvent is unlikely to touch the dicing tape attached on the back surface of the semiconductor wafer. This enables the dicing tape to be made of a material with poor solvent resistance.

In the method for fabricating a semiconductor device according to the present invention, a side surface of the adhesive layer is covered with a jig, before the solvent is injected to the holes in the detaching step.

In the detaching step, a jig covers a side surface of the adhesive layer, so that the solvent that has dissolved the adhesive layer does not leak outside (to the back surface of the semiconductor wafer, for example). Thus, it is even more unlikely that the solvent touches the dicing tape attached to the back surface of the semiconductor wafer.

In the method for fabricating a semiconductor device according to the present invention, a side surface of the adhesive layer is covered with a jig, before the solvent is injected to the grooves in the detaching step. The solvent is injected into the grooves through an injection opening provided through the jig.

In the detaching step, a jig is used to cover a side surface of the adhesive layer, so that the solvent that has dissolved the adhesive layer does not leak outside (to the back surface of the semiconductor wafer, for example). Thus, it is even more unlikely that the solvent touches the dicing tape attached to the back surface of the semiconductor wafer.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A method for fabricating a semiconductor device, the method comprising:
   a reinforcing step of bonding a reinforcing plate, via an adhesive layer, on a front surface of a semiconductor wafer bearing one or more semiconductor devices, the reinforcing plate having one or more holes that connect a front surface and a back surface of the reinforcing plate;
   a grinding step of grinding a back surface of the semiconductor wafer;
   a bonding step of bonding a dicing tape on the back surface of the semiconductor wafer after said grinding;
   a detaching step of detaching the reinforcing plate from the semiconductor wafer by injecting through said one or more holes a solvent for dissolving the adhesive layer;
   a dicing step of dicing the semiconductor wafer so as to separate the semiconductor devices into individual pieces,
   said bonding step being carried out after said grinding step and before said detaching step,
   said dicing step being carried out after said detaching step; and
   wherein, in said detaching step, a side surface of the adhesive layer is covered with a jig before the solvent is injected into said one or more holes.

2. The method as set forth in claim 1, the holes are scattered over the reinforcing plate.

3. The method as set forth in claim 1,
   wherein the holes are formed at regular intervals through the reinforcing plate, and
   wherein, in the detaching step, the solvent is injected to the adhesive layer through the holes that are formed at regular intervals.

4. A method for fabricating a semiconductor device, comprising:

a reinforcing step of bonding a reinforcing plate, via an adhesive layer, with a semiconductor wafer bearing a semiconductor device on its front surface, the reinforcing plate having a surface with one or more grooves that extend to a side surface of the reinforcing plate, wherein the reinforcing plate is bonded with the semiconductor wafer so that the surface with the grooves is in contact with the front surface of the semiconductor wafer;

a grinding step of grinding a back surface of the semiconductor wafer; and a detaching step of detaching the reinforcing plate from the front surface of the semiconductor wafer by injecting to at least one opening of said one or more grooves a solvent for dissolving the adhesive layer, the at least one opening being formed on the side surface of the reinforcing plate.

5. The method as set forth in claim 4, wherein the grooves are scattered over the reinforcing plate.

6. The method as set forth in claim 4, wherein the grooves are formed in the form of a lattice, and wherein, in the detaching step, the solvent is injected to the adhesive layer through the grooves formed in the form of a lattice.

7. The method as set forth in claim 4, further comprising:

a bonding step of bonding a dicing tape on the back surface of the semiconductor wafer after grinding; and a dicing step of dicing the semiconductor wafer so as to separate the semiconductor devices into individual pieces, said bonding step being carried out after said grinding step and before said detaching step, and said dicing step being carried out after said detaching step.

8. The method as set forth in claim 7, wherein, in said detaching step, a side surface of the adhesive layer is covered with a jig that includes an injection opening through which the solvent is injected to said one or more grooves.

9. The method of claim 4, wherein the reinforcing plate does not have any through-holes defined therein which extend from the front to back of the reinforcing plate, and the grooves are in a criss-crossing arrangement and an open side of each groove is exposed to the adhesive layer prior to the detaching step.

* * * * *